(12) United States Patent
Tsai et al.

(10) Patent No.: US 11,943,895 B2
(45) Date of Patent: Mar. 26, 2024

(54) LIQUID COOLING DEVICE AND ELECTRONIC DEVICE

(71) Applicant: COOLER MASTER CO., LTD., Taipei (TW)

(72) Inventors: Shui-Fa Tsai, Taipei (TW); Tsung-Wei Lin, Taipei (TW); Yu-Jyun Chen, Taipei (TW)

(73) Assignee: COOLER MASTER CO., LTD., Taipei (TW)

( * ) Notice: Subject to any disclaimer, the term of this patent is extended or adjusted under 35 U.S.C. 154(b) by 232 days.

(21) Appl. No.: 17/731,050

(22) Filed: Apr. 27, 2022

(65) Prior Publication Data

US 2023/0007812 A1 Jan. 5, 2023

(30) Foreign Application Priority Data

Jul. 5, 2021 (TW) .................................. 110124586

(51) Int. Cl.
*H05K 7/20* (2006.01)
*G06F 1/20* (2006.01)
*H05K 1/02* (2006.01)

(52) U.S. Cl.
CPC ......... *H05K 7/20263* (2013.01); *G06F 1/206* (2013.01); *H05K 1/0203* (2013.01); *H05K 7/20136* (2013.01); *H05K 7/20254* (2013.01); *H05K 7/20272* (2013.01)

(58) Field of Classification Search
CPC ............. H05K 7/20263; H05K 1/0203; H05K 7/20136; H05K 7/20254; H05K 7/20272; H05K 7/20772; H05K 7/2039; G06F 1/206; G06F 2200/201; G06F 1/20; Y02D 10/00
See application file for complete search history.

(56) References Cited

U.S. PATENT DOCUMENTS

| | | | | |
|---|---|---|---|---|
| 7,529,089 | B2* | 5/2009 | Cheng | H01L 23/427 165/104.34 |
| 8,045,327 | B2* | 10/2011 | Tomioka | H05K 7/20136 361/679.48 |
| 8,922,998 | B2* | 12/2014 | Campbell | H05K 7/2079 361/689 |
| 9,332,673 | B2* | 5/2016 | Boday | F28D 15/02 |
| 9,504,184 | B2* | 11/2016 | Krug, Jr. | H05K 7/20218 |
| 9,913,403 | B2* | 3/2018 | Krug, Jr. | H05K 7/20781 |
| 10,260,781 | B2* | 4/2019 | Lin | F25B 21/02 |
| 10,375,856 | B2* | 8/2019 | Tsai | F28F 9/002 |

(Continued)

*Primary Examiner* — Lisa Lea-Edmonds
(74) *Attorney, Agent, or Firm* — Maschoff Brennan

(57) ABSTRACT

This disclosure relates to a liquid cooling device including a first heat exchanger that has a first inlet and a first outlet, a second heat exchanger that has a second inlet and a second outlet, a heat dissipation component that has a first heat inlet, a second heat inlet, and a heat outlet, and a fluid driving component that has a fluid inlet, a first fluid outlet, and a second fluid outlet. The first heat inlet and the second heat inlet are in fluid communication with the heat outlet. The first heat inlet is in fluid communication with the first outlet. The second heat inlet is in fluid communication with the second outlet. The fluid inlet is in fluid communication with the heat outlet. The first fluid outlet and the second fluid outlet are respectively in fluid communication with the first heat inlet and the second heat inlet.

12 Claims, 5 Drawing Sheets

(56) References Cited

U.S. PATENT DOCUMENTS

| | | | |
|---|---|---|---|
| 11,755,079 B2* | 9/2023 | Chen | H05K 7/20254 |
| | | | 361/679.53 |
| 11,880,246 B2* | 1/2024 | Saksager | G06F 1/20 |
| 2011/0060470 A1* | 3/2011 | Campbell | G05D 23/1934 |
| | | | 700/282 |
| 2013/0105116 A1* | 5/2013 | Campbell | H05K 7/20272 |
| | | | 165/80.4 |
| 2013/0107457 A1* | 5/2013 | Campbell | H05K 7/2079 |
| | | | 361/699 |
| 2016/0242318 A1* | 8/2016 | Krug, Jr. | H05K 7/20254 |
| 2016/0295741 A1* | 10/2016 | Krug | H05K 7/20772 |
| 2018/0368285 A1* | 12/2018 | Arvelo | H05K 7/20772 |
| 2019/0232335 A1* | 8/2019 | Buvid | H05K 7/20254 |

* cited by examiner

LIQUID COOLING DEVICE AND ELECTRONIC DEVICE

CROSS-REFERENCE TO RELATED APPLICATIONS

This non-provisional application claims priority under 35 U.S.C. § 119(a) on Patent Application No(s). 110124586 filed in Taiwan, R.O.C. on Jul. 5, 2021, the entire contents of which are hereby incorporated by reference.

TECHNICAL FIELD

The present disclosure relates to a cooling device and an electronic device, more particularly to a liquid cooling device and an electronic device having the liquid cooling device.

BACKGROUND

A typical computer has a central processing unit for executing instructions and may have a graphics card for outputting images. It is known that the higher speed of the central processing unit and graphic card, the more heat is generated during operation. To ensure the performance of the central processing unit and graphic card and prevent them from overheating, most computers adopt air and/or water cooling systems to remove waste heat.

Liquid cooling transfers heat much faster than air circulated convection cooling. A conventional liquid cooling system has a water block for absorbing heat, a radiator for dissipating heat, and a pump for pumping the coolant. However, the conventional liquid cooling system is unable to support central processing unit and graphic card at the same time, as a result, a computer is needed to adopt at least two sets of cooling systems to remove heat generated by the central processing unit and graphic card. This not only increases cost but also makes the internal space utilization less flexible.

SUMMARY

The present disclosure provides a liquid cooling device and an electronic device which are capable of obtaining a balance between miniaturization of liquid cooling system and heat dissipation efficiency for both the central processing unit and the graphics card, where the arrangement of the liquid cooling system is beneficial to achieve a flexible internal space utilization of the electronic device and therefore prevents from affecting the efficiency of air-cooling.

According to one aspect of the present disclosure, a liquid cooling device configured to cool a first heat source and a second heat source includes a first heat exchanger, a second heat exchanger, a heat dissipation component, and a fluid driving component. The first heat exchanger has a first inlet and a first outlet, and the first heat exchanger is configured to be thermally coupled with the first heat source. The second heat exchanger has a second inlet and a second outlet, and the second heat exchanger is configured to be thermally coupled with the second heat source. The heat dissipation component has a first heat inlet, a second heat inlet, and a heat outlet. The first heat inlet and the second heat inlet are in fluid communication with the heat outlet. The first heat inlet is in fluid communication with the first outlet. The second heat inlet is in fluid communication with the second outlet. The fluid driving component has a fluid inlet, a first fluid outlet, and a second fluid outlet. The fluid inlet is in fluid communication with the heat outlet. The first fluid outlet and the second fluid outlet are respectively in fluid communication with the first heat inlet and the second heat inlet.

According to the liquid cooling device and the electronic device discussed above, these two circulation path share the fluid driving component and the heat dissipation component; that is, these two circulation path share the same pump and the same radiator. As such, the liquid cooling device is able to support at least two heat sources that are arranged at different places at the same time with the least number of pump and radiator possible. Thus, the liquid cooling device is beneficial to achieve a flexible internal space utilization of the electronic device to achieve a balance between the miniaturization of liquid cooling device and the heat dissipation efficiency for both the central processing unit and the graphics card.

In addition, the first circuit board and the second circuit board are respectively disposed at two opposite sides of the bracket. In this arrangement, the bracket prevents heat generated by the first electronic component and the second electronic component from affecting each other.

BRIEF DESCRIPTION OF THE DRAWINGS

The present disclosure will become more fully understood from the detailed description given hereinbelow and the accompanying drawings which are given by way of illustration only and thus are not intending to limit the present disclosure and wherein.

DETAILED DESCRIPTION

Aspects and advantages of the invention will become apparent from the following detailed descriptions with the accompanying drawings. For purposes of explanation, one or more specific embodiments are given to provide a thorough understanding of the invention, and which are described in sufficient detail to enable one skilled in the art to practice the described embodiments. It should be understood that the following descriptions are not intended to limit the embodiments to one specific embodiment. On the contrary, it is intended to cover alternatives, modifications, and equivalents as can be included within the spirit and scope of the described embodiments as defined by the appended claims.

Figure 1:
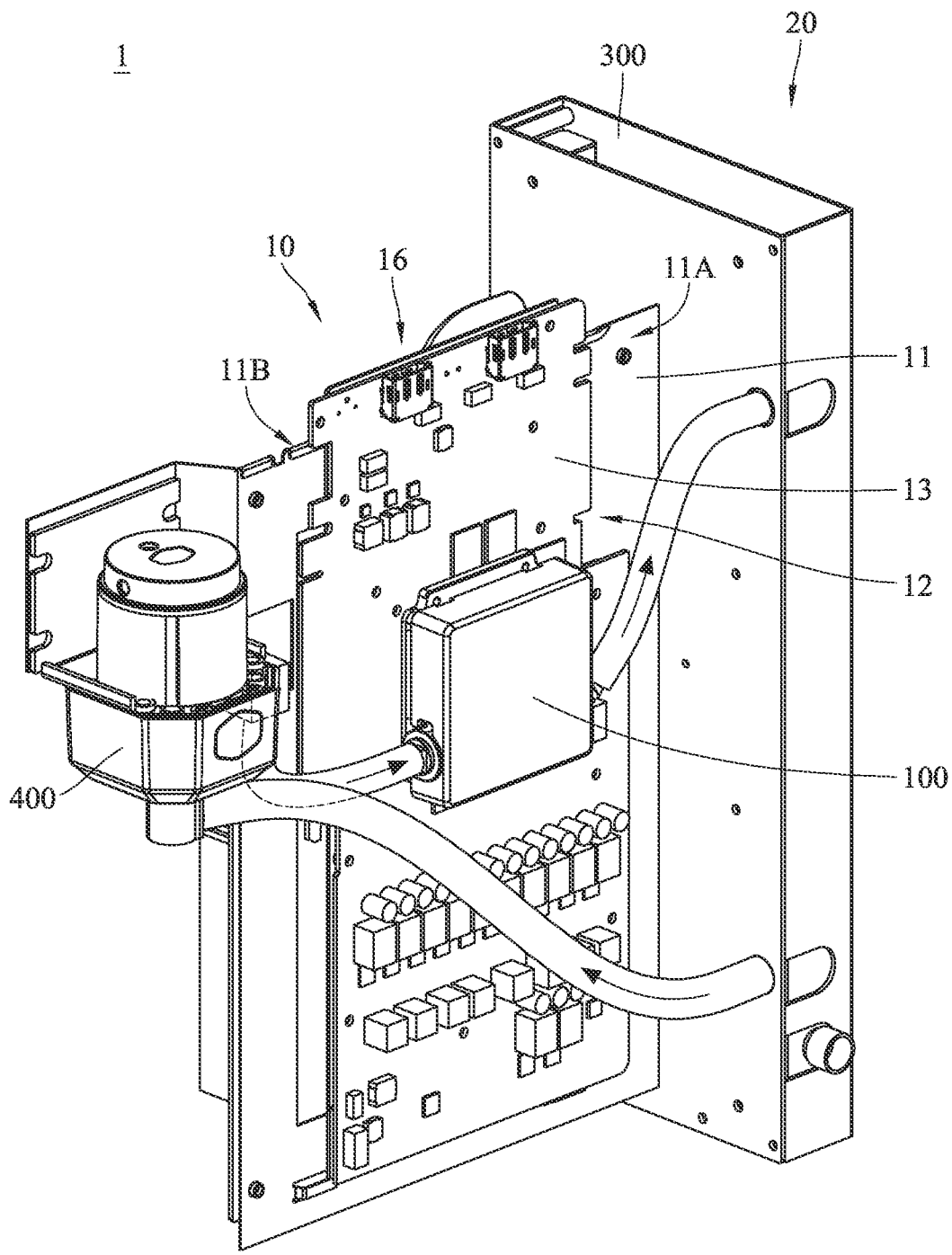
FIG. 1 is a partial perspective view of an electronic device according to a first embodiment of the present disclosure.
Figure 2:
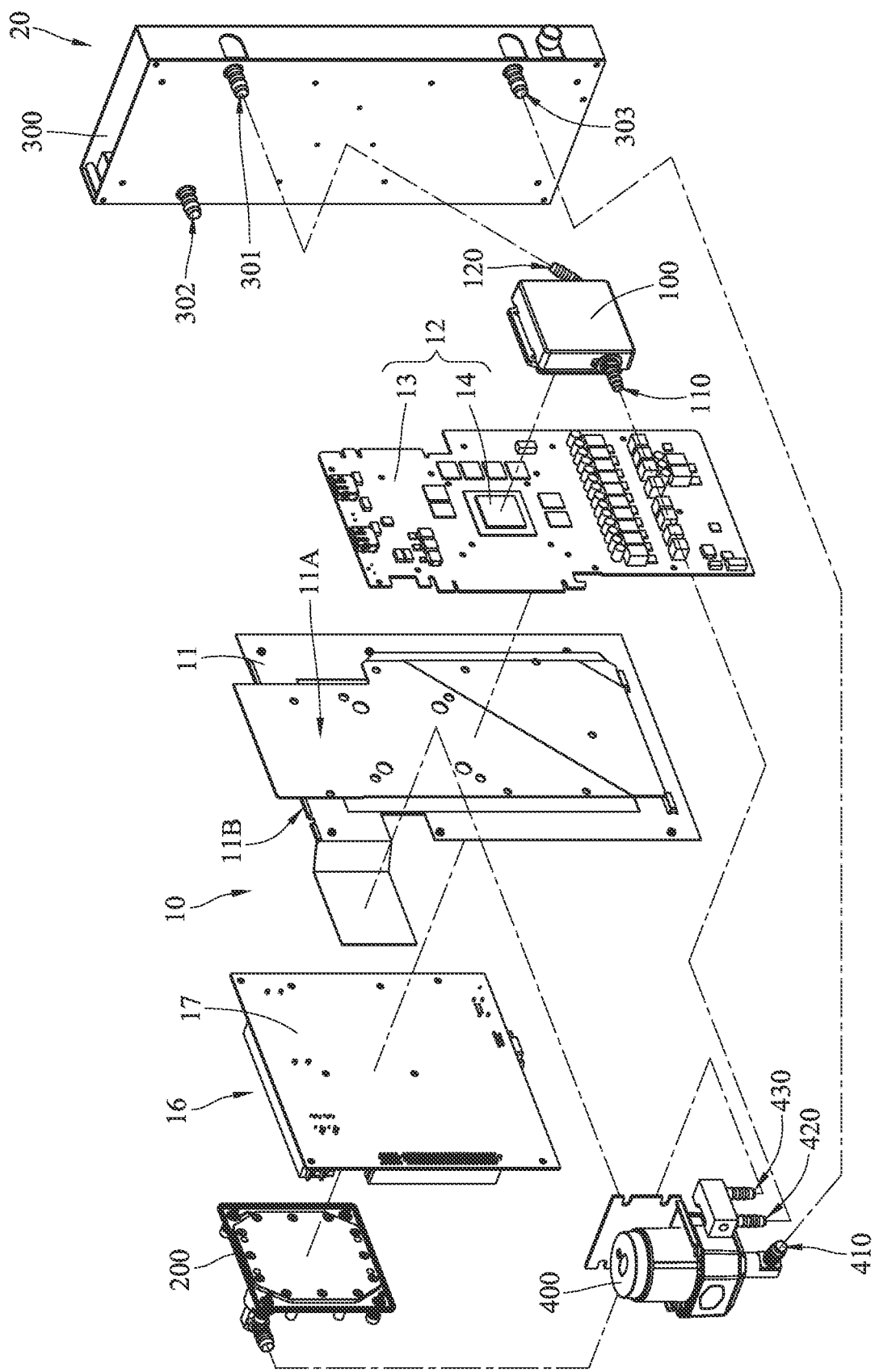
FIG. 2 is an exploded view of the electronic device in FIG. 1.
Figure 3:
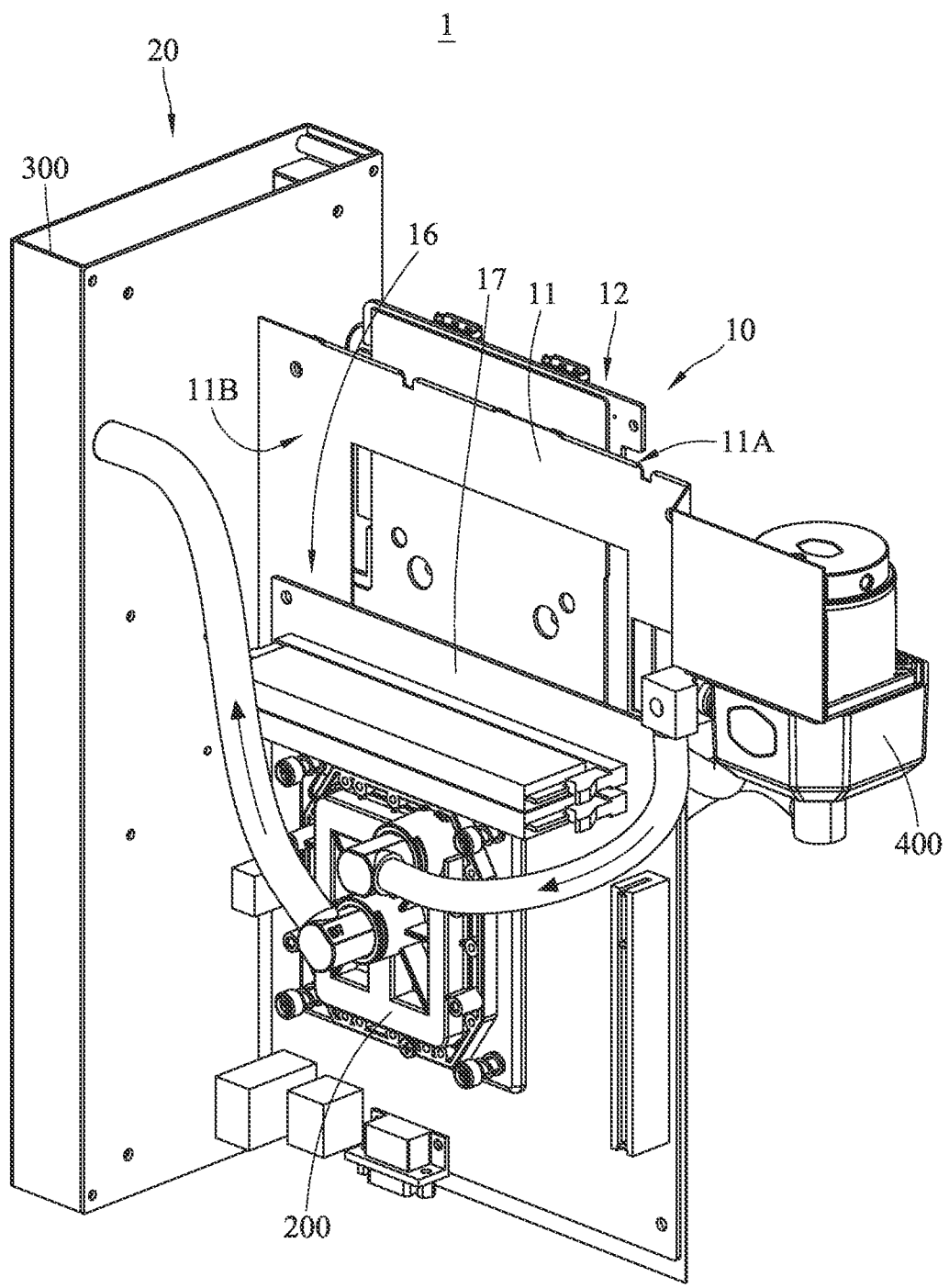
FIG. 3 is another partial perspective view of the electronic device in FIG. 1.
Figure 4:
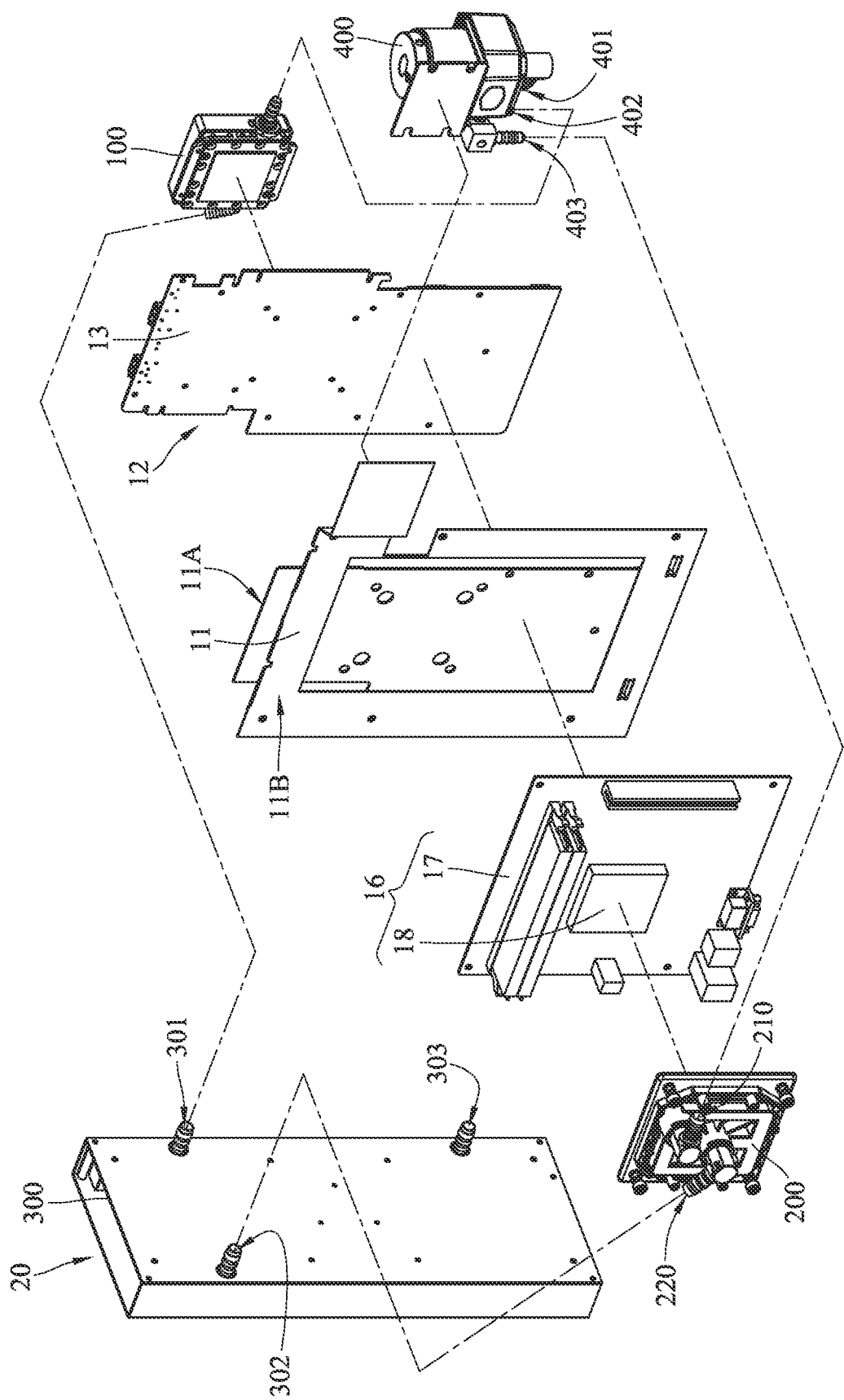
FIG. 4 is an exploded view of the electronic device in FIG. 3.
Figure 5:
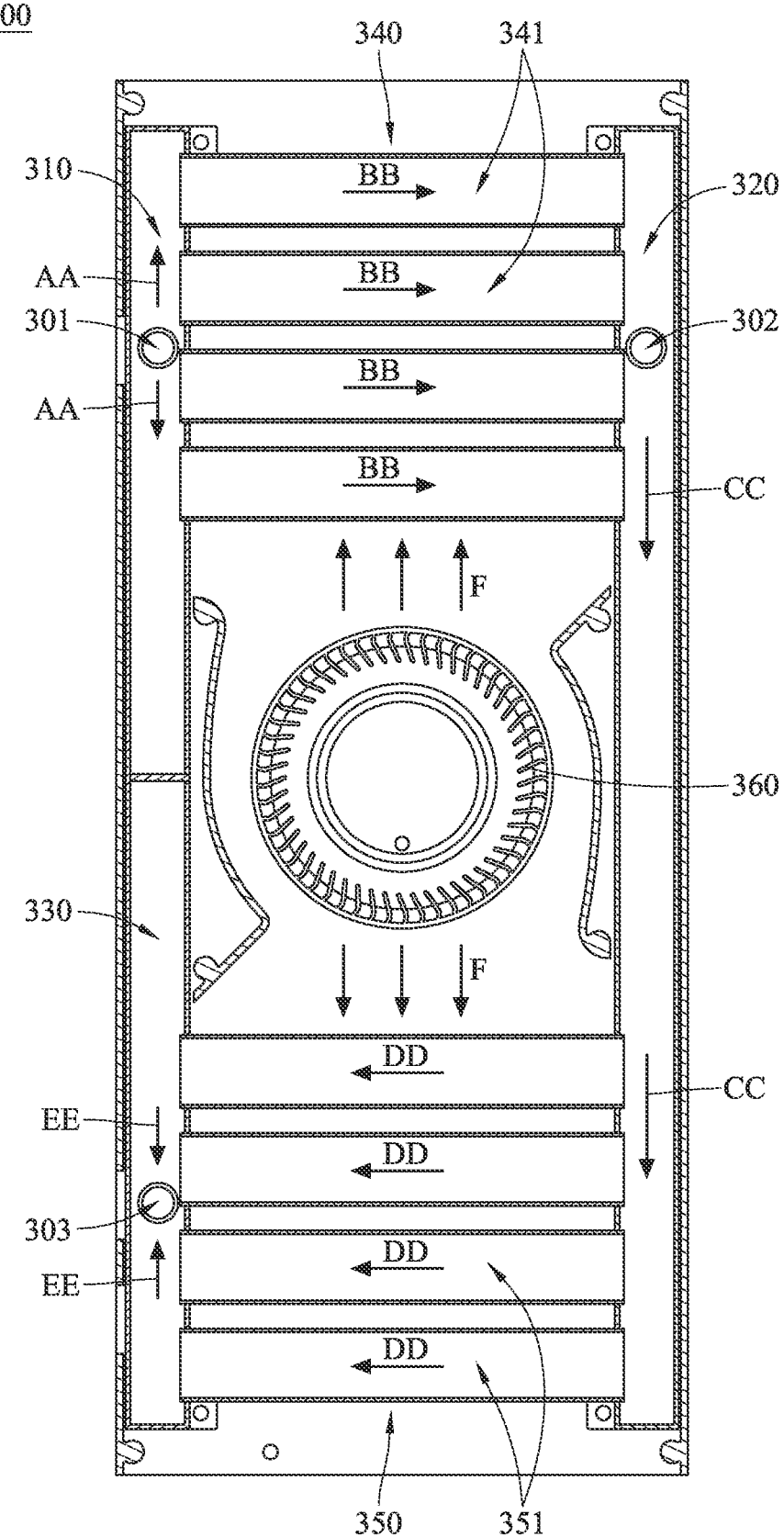
FIG. 5 is a cross-sectional view of a heat dissipation component of the electronic device in FIG. 1.

Please refer to FIG. 1 to FIG. 5, where FIG. 1 is a partial perspective view of an electronic device 1 according to a first embodiment of the present disclosure, FIG. 2 is an exploded view of the electronic device 1 in FIG. 1, FIG. 3 is another partial perspective view of the electronic device 1 in FIG. 1, FIG. 4 is an exploded view of the electronic device 1 in FIG. 3, and FIG. 5 is a cross-sectional view of a heat dissipation component 300 of the electronic device 1 in FIG. 1.

In this embodiment, the electronic device 1 may be a computer host or a server. The electronic device 1 includes a main body 10 and a liquid cooling device 20. The main body 10 includes a bracket 11, a first electronic component 12, and a second electronic component 16. The first electronic component 12 and the second electronic component 16 are respectively disposed at opposite sides of the bracket 11. In detail, the bracket 11 has a first surface 11A and a second surface 11B. The second surface 11B faces away from the first surface 11A. In one embodiment, the bracket 11 may be placed in a vertical manner; in this case, a normal direction of the first surface 11A of the bracket 11 may be perpendicular to a plumb line. Note that the bracket 11 in other embodiments may be placed in a horizontal manner. The first electronic component 12 includes a first circuit board 13 and a first heat source 14 disposed on the first circuit board 13. The first circuit board 13 is disposed on the first surface 11A of the bracket 11. The second electronic component 16 includes a second circuit board 17 and a second heat source 18 disposed on the second circuit board 17. The second circuit board 17 is disposed on the second surface 11B of the bracket 11. As shown, the first circuit board 13 and the second circuit board 17 are respectively disposed at two opposite sides of the bracket 11. In this arrangement, the bracket 11 prevents heat generated by the first electronic component 12 and the second electronic component 16 from affecting each other.

In this embodiment, the first electronic component 12 may be a graphics card; that is, the first circuit board 13 may be a circuit board of the graphics card, and the first heat source 14 may be an image processor of the graphics card. The second electronic component 16 may be a motherboard assembly; that is, the second circuit board 17 may be a motherboard, and the second heat source 18 may be a central processing unit.

Note that the main body 10 may further include a casing, a power supply, a hard disk device, etc., but these components are omitted from the drawings for simplicity.

The liquid cooling device 20 is configured to dissipate heat generated by the first heat source 14 and the second heat source 18. The liquid cooling device 20 may contain any suitable coolant (e.g., water or any typical refrigerant) circulated therein. The liquid cooling device 20 includes a first heat exchanger 100, a second heat exchanger 200, a heat dissipation component 300, and a fluid driving component 400. The first heat exchanger 100 (can be served as a cold plate) has a first inlet 110 and a first outlet 120 and is thermally coupled with the first heat source 14. The second heat exchanger 200 (can be served as a cold plate) has a second inlet 210 and a second outlet 220 and is thermally coupled with the second heat source 18. Note that "one component is thermally couple with another component" refers to the mentioned components being in direct or indirect thermal contact with each other.

As shown in FIGS. 2, 3, and 5, the heat dissipation component 300 (can be served as a radiator) includes a first heat inlet 301, a second heat inlet 302, a heat outlet 303, a first inlet chamber 310, a second inlet chamber 320, an outlet chamber 330, a first heat dissipation structure 340, and a second heat dissipation structure 350. The first heat inlet 301 and the second heat inlet 302 are in fluid communication with the heat outlet 303. The first heat inlet 301 is in fluid communication with the first outlet 120. The second heat inlet 302 is in fluid communication with the second outlet 220. The first inlet chamber 310 is in fluid communication with the first heat inlet 301. The second inlet chamber 320 is in fluid communication with the second heat inlet 302. The outlet chamber 330 is in fluid communication with the heat outlet 303. The first heat dissipation structure 340 includes a plurality of first channels 341. The first channels 341 are in fluid communication with the first inlet chamber 310 and the second inlet chamber 320. The second heat dissipation structure 350 includes a plurality of second channels 351. The second channels 351 are in fluid communication with the second inlet chamber 320 and the outlet chamber 330.

The coolant is pumped into the heat dissipation component 300 via the first heat inlet 301 or the second heat inlet 302. Taking the first heat inlet 301 as an example, the first heat inlet 301 allows the coolant to flow into the first inlet chamber 310 (as indicated by arrows AA), and then the coolant flows towards the second inlet chamber 320 via the first channels 341 of the first heat dissipation structure 340 (as indicated by arrows BB). This causes the coolant in the second inlet chamber 320 to flow towards the end of the second inlet chamber 320 located away from the first heat dissipation structure 340 (as indicated by arrows CC). Then, the coolant flows into the second channels 351 of the second heat dissipation structure 350 (as indicated by arrows DD) and then enter the outlet chamber 330. Then, the coolant is discharged out of the outlet chamber 330 via the heat outlet 303 (as indicated by arrows EE).

It is understandable that the coolant flowing through the second heat inlet 302 will flow as indicated by the arrows CC, DD, and EE. In specific, the second heat inlet 302 allows the coolant to flow into the second inlet chamber 320, and then the coolant in the second inlet chamber 320 flows towards the end of the second inlet chamber 320 located away from the first heat dissipation structure 340 (as indicated by arrows CC). Then, the coolant flows into the second channels 351 of the second heat dissipation structure 350 (as indicated by arrows DD) and then enter the outlet chamber 330. Then, the coolant is discharged out of the outlet chamber 330 via the heat outlet 303 (as indicated by arrows EE).

The heat contained in the coolant can be dissipated to the ambient air while the coolant is flowing through the first heat dissipation structure 340 and the second heat dissipation structure 350. Optionally, one or more heatsinks (not shown) can be mounted or integrally formed on the first heat dissipation structure 340 and/or the second heat dissipation structure 350 to achieve a better heat exchange efficiency.

The fluid driving component 400 may be a pump configured to pump the coolant.

The fluid driving component 400 has a fluid inlet 410, a first fluid outlet 420, and a second fluid outlet 430. The fluid inlet 410 is in fluid communication with the heat outlet 303. The first fluid outlet 420 is in fluid communication with the first heat inlet 301 via the first heat exchanger 100. The second fluid outlet 430 is in fluid communication with the second heat inlet 302 via the second heat exchanger 200. Accordingly, the first heat exchanger 100, the second heat exchanger 200, the heat dissipation component 300, and the fluid driving component 400 together form two circulation paths. One of the circulation paths can be seen from the arrows shown in FIG. 1, the coolant can be pumped through the first heat exchanger 100, the heat dissipation component 300, and the fluid driving component 400; in specific, the coolant absorbs heat generated by the first heat source 14 when passing through the first heat exchanger 100, then the heat contained in the coolant is dissipated to the outside when the coolant is flowing through the heat dissipation component 300, and then the coolant is sent back to the fluid driving component 400 to finish one circulation.

The other circulation path can be seen from the arrows in FIG. 3, the coolant can be pumped through the second heat exchanger 200, the heat dissipation component 300, and the fluid driving component 400; in specific, the coolant absorbs heat generated by the second heat source 18 when passing through the second heat exchanger 200, then the heat contained in the coolant is dissipated to the outside when the coolant is flowing through the heat dissipation component 300, and then the coolant is sent back to the fluid driving component 400 to finish the other circulation.

As discussed, these two circulation path share the fluid driving component 400 and the heat dissipation component 300; that is, these two circulation path share the same pump and the same radiator. As such, the liquid cooling device 20 is able to support at least two heat sources that are arranged at different places at the same time with the least number of pump and radiator possible. Thus, the liquid cooling device 20 is beneficial to achieve a flexible internal space utilization of the electronic device 1 to achieve a balance between the miniaturization of liquid cooling device 20 and the heat dissipation efficiency for both the central processing unit and the graphics card.

Optionally, in this embodiment, the heat dissipation component 300 may further include a centrifugal air generator 360. The centrifugal air generator 360 may be a centrifugal fan. The centrifugal air generator 360 may be located between the first heat dissipation structure 340 and the second heat dissipation structure 350 and configured to generate airflows F towards the first heat dissipation structure 340 and the second heat dissipation structure 350 to increase the heat exchange efficiency of the heat dissipation component 300 with outside.

According to the liquid cooling device and the electronic device discussed above, these two circulation path share the fluid driving component and the heat dissipation component; that is, these two circulation path share the same pump and the same radiator. As such, the liquid cooling device is able to support at least two heat sources that are arranged at different places at the same time with the least number of pump and radiator possible. Thus, the liquid cooling device is beneficial to achieve a flexible internal space utilization of the electronic device to achieve a balance between the miniaturization of liquid cooling device and the heat dissipation efficiency for both the central processing unit and the graphics card.

In addition, the first circuit board and the second circuit board are respectively disposed at two opposite sides of the bracket. In this arrangement, the bracket prevents heat generated by the first electronic component and the second electronic component from affecting each other.

The embodiments are chosen and described in order to best explain the principles of the present disclosure and its practical applications, to thereby enable others skilled in the art best utilize the present disclosure and various embodiments with various modifications as are suited to the particular use being contemplated. It is intended that the scope of the present disclosure is defined by the following claims and their equivalents.

What is claimed is:

1. A liquid cooling device configured to cool a first heat source and a second heat source, comprising:
   a first heat exchanger having a first inlet and a first outlet, wherein the first heat exchanger is configured to be thermally coupled with the first heat source;
   a second heat exchanger having a second inlet and a second outlet, wherein the second heat exchanger is configured to be thermally coupled with the second heat source;
   a heat dissipation component having a first heat inlet, a second heat inlet, and a heat outlet, wherein the first heat inlet and the second heat inlet are in fluid communication with the heat outlet, the first heat inlet is in fluid communication with the first outlet, and the second heat inlet is in fluid communication with the second outlet; and
   a fluid driving component having a fluid inlet, a first fluid outlet, and a second fluid outlet, wherein the fluid inlet is in fluid communication with the heat outlet, and the first fluid outlet and the second fluid outlet are respectively in fluid communication with the first heat inlet and the second heat inlet.

2. The liquid cooling device according to claim 1, wherein the first heat exchanger and the second heat exchanger are cold plates, and the heat dissipation component is a radiator.

3. The liquid cooling device according to claim 2, wherein the heat dissipation component comprises a first inlet chamber, a second inlet chamber, an outlet chamber, a first heat dissipation structure, and a second heat dissipation structure, the first inlet chamber is in fluid communication with the first heat inlet, the second inlet chamber is in fluid communication with the second heat inlet, the outlet chamber is in fluid communication with the heat outlet, the first heat dissipation structure is in fluid communication with the first inlet chamber and the second inlet chamber, and the second heat dissipation structure is in fluid communication with the second inlet chamber and the outlet chamber.

4. The liquid cooling device according to claim 3, further comprising centrifugal air generator, wherein the centrifugal air generator is disposed on the heat dissipation component and located between the first heat dissipation structure and the second heat dissipation structure, and the centrifugal air generator is configured to generate an airflow towards the first heat dissipation structure and the second heat dissipation structure.

5. An electronic device, comprising:
   a main body, comprising a bracket, a first electronic component, and a second electronic component, wherein the first electronic component and the second electronic component are respectively disposed at two opposite sides of the bracket; and
   a liquid cooling device, comprising:
      a first heat exchanger having a first inlet and a first outlet, wherein the first heat exchanger is configured to be thermally coupled with the first electronic component;
      a second heat exchanger having a second inlet and a second outlet, wherein the second heat exchanger is configured to be thermally coupled with the second electronic component;
      a heat dissipation component having a first heat inlet, a second heat inlet, and a heat outlet, wherein the first heat inlet and the second heat inlet are in fluid communication with the heat outlet, the first heat inlet is in fluid communication with the first outlet, and the second heat inlet is in fluid communication with the second outlet; and
      a fluid driving component having a fluid inlet, a first fluid outlet, and a second fluid outlet, wherein the fluid inlet is in fluid communication with the heat outlet, and the first fluid outlet and the second fluid outlet are respectively in fluid communication with the first heat inlet and the second heat inlet.

6. The electronic device according to claim 5, wherein the bracket has a first surface and a second surface, the second surface faces away from the first surface, the first electronic component is disposed on the first surface, and the second electronic component is disposed on the second surface.

7. The electronic device according to claim 6, wherein a normal direction of the first surface is perpendicular to a plumb line.

8. The electronic device according to claim 5, wherein the first electronic component comprises a first circuit board and a first heat source, the first heat source is disposed on the first circuit board, the second electronic component comprises a second circuit board and a second heat source, the second heat source is disposed on the second circuit board, the first heat exchanger is thermally coupled with the first heat source, and the second heat exchanger is thermally coupled with the second heat source.

9. The electronic device according to claim 8, wherein the first heat source is central processing unit, and the second heat source is an image processor.

10. The electronic device according to claim 5, wherein the first heat exchanger and the second heat exchanger are cold plates, and the heat dissipation component is a radiator.

11. The electronic device according to claim 10, wherein the heat dissipation component comprises a first inlet chamber, a second inlet chamber, an outlet chamber, a first heat dissipation structure, and a second heat dissipation structure, the first inlet chamber is in fluid communication with the first heat inlet, the second inlet chamber is in fluid communication with the second heat inlet, the outlet chamber is in fluid communication with the heat outlet, the first heat dissipation structure is in fluid communication with the first inlet chamber and the second inlet chamber, and the second heat dissipation structure is in fluid communication with the second inlet chamber and the outlet chamber.

12. The electronic device according to claim 11, further comprising a centrifugal air generator, wherein the centrifugal air generator is disposed on the heat dissipation component and located between the first heat dissipation structure and the second heat dissipation structure, and the centrifugal air generator is configured to generate an airflow towards the first heat dissipation structure and the second heat dissipation structure.

* * * * *